US006692267B1

United States Patent
Schmukler et al.

(10) Patent No.: US 6,692,267 B1
(45) Date of Patent: Feb. 17, 2004

(54) PRINTED CIRCUIT BOARD TESTING MODULE

(75) Inventors: Joseph A. Schmukler, Glenwood, MD (US); Dean Michael Cymek, Havre de Grace, MD (US); Iqbal Dar, Marriottsville, MD (US)

(73) Assignee: Ciena Corporation, Linthicum, MD (US)

(*) Notice: Subject to any disclaimer, the term of this patent is extended or adjusted under 35 U.S.C. 154(b) by 214 days.

(21) Appl. No.: 10/006,487

(22) Filed: Dec. 6, 2001

Related U.S. Application Data

(60) Provisional application No. 60/314,283, filed on Aug. 23, 2001.

(51) Int. Cl.$^7$ .............................................. H01R 12/00
(52) U.S. Cl. ...................................................... 439/76.1
(58) Field of Search ............................ 439/76.1, 76.2, 439/581, 63; 174/65 R; 333/33, 260

(56) References Cited

U.S. PATENT DOCUMENTS

| | | | | |
|---|---|---|---|---|
| 4,346,355 A | * | 8/1982 | Tsukii | 333/33 |
| 4,669,805 A | * | 6/1987 | Kosugi et al. | 439/581 |
| 4,733,202 A | * | 3/1988 | Forterre et al. | 333/26 |
| 4,855,697 A | * | 8/1989 | Jones et al. | 333/33 |
| 4,867,704 A | * | 9/1989 | Standke | 439/581 |
| 4,984,990 A | * | 1/1991 | Lindahl | 439/63 |
| 4,995,815 A | * | 2/1991 | Buchanan et al. | 439/63 |
| 5,198,754 A | * | 3/1993 | Binet | 324/158.1 |
| 5,336,113 A | * | 8/1994 | Chanteau | 439/581 |
| 5,550,521 A | * | 8/1996 | Bernaud et al. | 333/260 |
| 5,670,744 A | * | 9/1997 | Ritchey | 174/51 |
| 5,763,830 A | * | 6/1998 | Hsueh | 174/60 |
| 5,897,384 A | * | 4/1999 | Hosler, Sr. | 439/63 |
| 5,906,512 A | * | 5/1999 | Reynolds | 439/579 |
| 5,914,863 A | * | 6/1999 | Shen | 361/752 |
| 6,106,304 A | * | 8/2000 | Huang | 439/63 |

* cited by examiner

*Primary Examiner*—Ross Gushi
(74) *Attorney, Agent, or Firm*—Michael R. Cammarata; James M. Olsen

(57) ABSTRACT

A module for holding a printed circuit board (PCB) includes rectangular-shaped, mating top and bottom brackets. Three walls of the top bracket retain SMA connectors that interconnect with the PCB. A dielectric gasket is provided below each SMA connector to provide pressure on the leads thereof so that the leads adequately contact corresponding pads on the PCB. Two walls of the bottom bracket include channels that slidably receive and retain the PCB therein, and another wall includes a stop channel that retains an edge portion of the PCB when the PCB is slid through the channels. The bottom bracket also has diamond-shaped pads and a square-shaped pad connected between two walls thereof that align with and support corresponding components provided on the PCB and dissipate heat generated thereby. A cable connector provided on one end of an electrical cable connects to each SMA connector, and the other ends of the electrical cables connect to testing equipment. Thus, when the top bracket is connected to the bottom bracket, the dielectric gaskets provide pressure on SMA connector leads so that the leads adequately contact corresponding pads on the PCB and enable the PCB to be tested without being permanently affixed to the module. The module may be attached to a heatsink that, in conjunction with the diamond-shaped pads and the square-shaped pad, permits heat to be dissipated from the PCB at the same rate that heat is dissipated from an installed PCB.

18 Claims, 2 Drawing Sheets

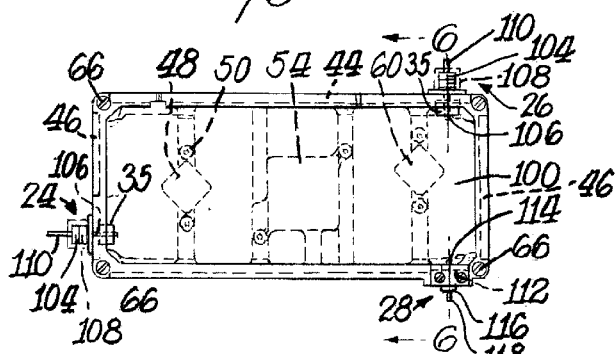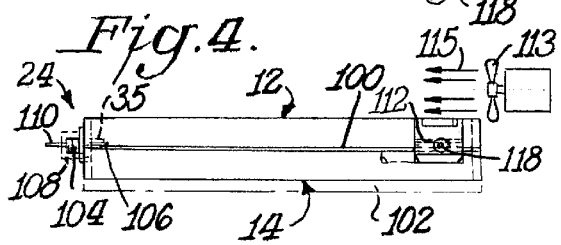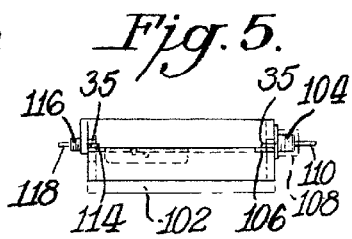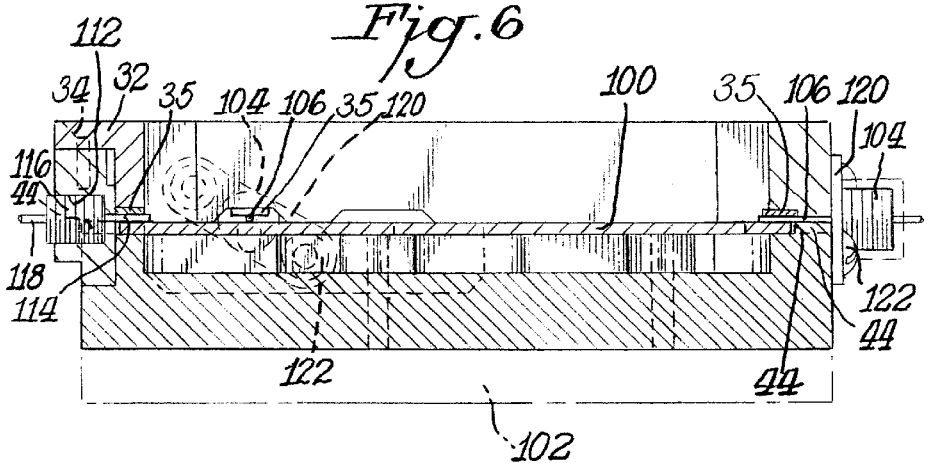

PRINTED CIRCUIT BOARD TESTING MODULE

CROSS REFERENCE TO RELATED APPLICATION

The present application claims the benefit of the filing date of U.S. Provisional Application No. 60/314,283, filed on Aug. 23, 2001, the teachings of which are incorporated herein by reference.

BACKGROUND OF THE INVENTION

A. Field of the Invention

The present invention relates generally to the communications field, and, more particularly to a module for holding printed circuit boards (PCB) used in the communications field.

B. Description of the Related Art

Printed circuit board (PCB) assemblies are used in computers, communications equipment, televisions, and many other products. In a typical PCB assembly, many electrical components are attached to the top and bottom surfaces of a PCB. Since the electronics manufacturing industry is highly competitive, it is important to maximize the throughput of processing PCB assemblies and to securely attach functional electrical components to the PCBs.

The manufacturing of PCB assemblies involves many processes, one of which is surface mounting components to PCBs. In addition to maximizing the throughput of processing PCB assemblies, it is also becoming important to accurately mount a large number of very small components to one side of the PCB assemblies. Once the PCB is completed, tests need to be performed upon the PCB to ensure its functionality and validate the PCB. Furthermore, tests need to be performed when PCBs fail in the field.

When components are mounted onto a PCB or a PCB is tested, the PCB is typically mounted in a fixture that holds the PCB. Conventional PCB fixtures hold a single PCB in a horizontal plane so that one side of the PCB may be processed or tested. Typically, the PCB is soldered to conventional connections provided on conventional fixtures. After the PCB is soldered and tested, it is difficult to remove the PCB from the soldered connections without damaging or destroying the PCB. Thus, it is essential that PCBs be easily removed from a fixture, without damaging or destroying the PCB.

When a PCB is being tested, it must be removed from its assembly in which it normally operates. Typical PCB assemblies include walls and mechanisms for cooling the PCBs contained therein, such as heatsinks and fans. Unfortunately, when PCBs are removed from their assemblies and are electrically connected for testing purposes, the heat generated by the PCB is not sufficiently dissipated which increases the PCB temperature significantly. In other words, conventional PCB fixtures fail to provide a mechanism to cool the PCB as it is being tested outside the assembly in which it normally operates. The increased heat may damage the PCB, adding significant costs for replacement or repair of the damaged PCB. The heat may also create latent defects in the PCB that do not surface until after the PCB is in operation. Moreover, some PCBs have a narrow operating range such that significant deviations in temperature will affect the performance of the PCB and may lead to inaccurate testing results.

Therefore, there is a significant need in the art to quickly, consistently, and temporarily support PCB assemblies with different configurations of components in the manufacturing and testing of PCB assemblies. There is also a need in the art for a PCB fixture that does not damage the PCB upon removal therefrom, and provides a mechanism to dissipate heat from the PCB being tested at the same rate as if the PCB were installed in an assembly in which the PCB normally operates.

SUMMARY OF THE INVENTION

The present invention solves the problems of the related art by providing a module that holds a PCB for processing, testing, and validating, and which provides mechanisms for cooling the PCB as it is being processed or tested.

As embodied and described herein, the present invention is broadly drawn to a module for holding a printed circuit board (PCB) that includes mating top and bottom brackets. The top bracket has four walls, and the bottom bracket slidably receives and retains the printed circuit board. At least one wall of the top or bottom brackets retains an electrical connector having a lead. The module further includes a dielectric gasket provided on one side of the electrical connector lead. A portion of a connection force provided by the top and bottom brackets sandwiching the electrical connector lead and the dielectric gasket, is transferred through the dielectric gasket to the electrical connector lead, and electrically connects the electrical connector lead with a pad of the PCB.

In a specific embodiment, the invention three walls of the top bracket retain SMA connectors that interconnect with the PCB. A dielectric gasket is provided below each SMA connector to apply pressure on the leads thereof so that the leads adequately contact corresponding pads on the PCB. Two walls of the bottom bracket include channels that slidably receive and retain the PCB therein, and another wall includes a stop channel that retains an edge portion of the PCB when the PCB is slid through the channels. The bottom bracket also has diamond-shaped pads and a square-shaped pad, connected between two walls thereof, that align with and support corresponding components provided on the PCB and dissipate heat generated thereby. A cable connector provided on one end of an electrical cable connects to each SMA connector, and the other ends of the electrical cables connect to testing equipment. Thus, when the top bracket is connected to the bottom bracket, the dielectric gaskets provide pressure on SMA connector leads so that the leads electrically contact corresponding pads on the PCB and enable the PCB to be tested without being permanently affixed to the module. The module may be attached to a heatsink that, in conjunction with the diamond-shaped pads and the square-shaped pad, permits heat to be dissipated from the PCB at the same rate that heat is dissipated from an installed PCB.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a top plan view of the printed circuit board testing module shown in FIGS. 1 and 2;

FIG. 4 is a front elevational view of the printed circuit board testing module shown in FIGS. 1–3;

FIG. 5 is a right side elevational view of the printed circuit board testing module shown in FIGS. 1–4; and FIG. 6 is a cross-sectional view of the printed circuit board testing module shown in FIGS. 1–5, taken along line 6—6 of FIG. 3.

DETAILED DESCRIPTION OF EMBODIMENTS OF THE INVENTION

The following detailed description of the invention refers to the accompanying drawings. The same reference numbers in different drawings identify the same or similar elements. Also, the to following detailed description does not limit the invention. Instead, the scope of the invention is defined by the appended claims and equivalents thereof.

Figure 1:
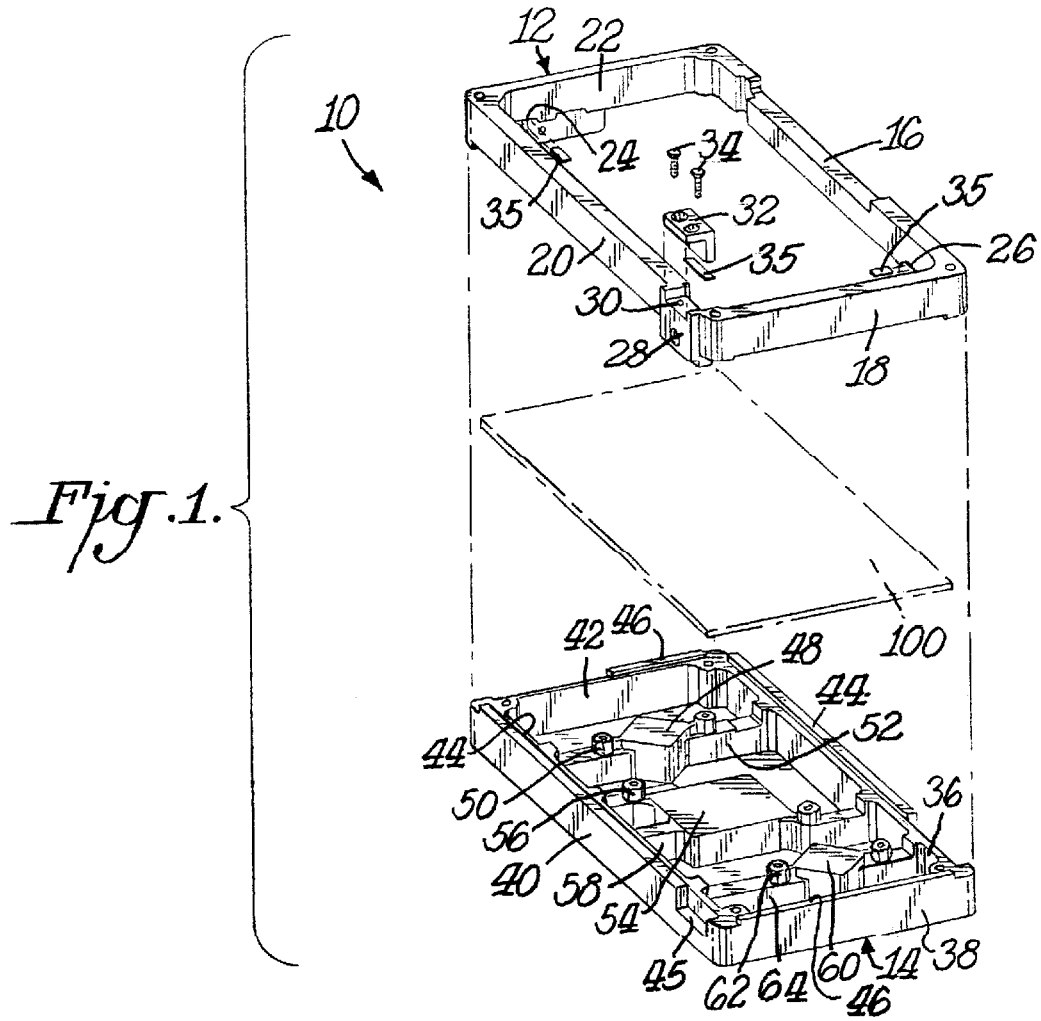
FIG. 1 is an exploded perspective view of a printed circuit board testing module in accordance with an embodiment of the present invention.
Figure 2:
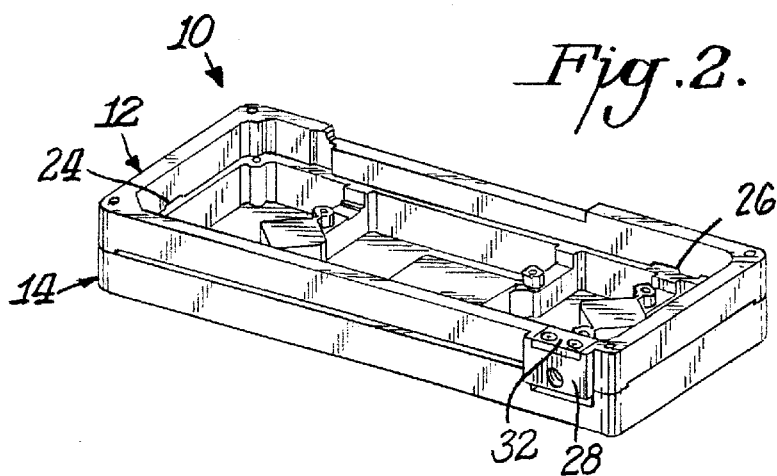
FIG. 2 is a joined perspective view of the printed circuit board testing module shown in FIG. 1.

Referring now specifically to the drawings, an embodiment of the module of the present invention is illustrated in FIGS. 1–6, and shown generally as reference numeral 10. As shown in FIGS. 1 and 2, module 10 includes a top bracket 12 and bottom bracket 14 that retain a printed circuit board (PCB) 100 therebetween. Top and bottom brackets 12, 14 are substantially open to permit access to the components mounted on both the top and bottom of PCB 100. Thus, module 10 may be used with PCBs having components mounted on the top of the PCB, the bottom, or both.

Top bracket 12 may be a variety of shapes, depending upon the shape of the PCB 100. In this embodiment, however, top bracket 12 is a rectangle having four walls 16, 18, 20, 22 that are either interconnected or integrally formed. Walls 22, 16 may include locations 24, 26, respectively, for provision of a connector that interconnects with PCB 100, as described more fully below. Wall 20 may also include a location 28 for provision of a connector that interconnects with PCB 100. Location 28 has a recess 30 for receiving and retaining an L-shaped support bracket 32 therein. L-shaped support bracket 32 may be retained in recess 30 via various connection mechanisms. For example, bracket 32 may connect to recess 30 with an adhesive, glue, double-sided tape, nuts and bolts, etc. As shown in FIG. 1, however, bracket 32 may connect to recess 30 by providing two mount screws 34 through holes formed in recess 30.

Gaskets or pads 35 may be provided at connector locations 24, 26, 28 to provide pressure on the leads of the connectors so that the leads adequately and electrically contact corresponding pads (e.g., contact pads or solder pads) on PCB 100, which, in turn, electrically connects PCB 100 to external testing equipment (not shown). This way, PCB 100 may be tested without being permanently affixed to module 10, preventing damage to PCB 100 when it is removed from module 10. Gaskets 35 may be constructed from various materials, but preferably are made from a material that absorbs the force applied to the connector leads and electrically isolates and insulates the leads to prevent electrical signals and/or frequencies from the leads from intermixing. Such a material may be a microwave-absorbable and radar-absorbable (dielectric) material, such as the Magnetic Radar Absorbing Material, sold under the trade name MAGRAM by ARC Technologies, Inc., of Amesbury, Mass.

Bottom bracket 14 may be a variety of shapes, depending upon the shape of the PCB 100. In this embodiment, however, bottom bracket 14 matches the shape of top bracket 12, and thus, is a rectangle having four walls 36,38,40,42 that are either interconnected or integrally formed. Walls 36, 40 may include slots or channels 44 that slidably receive and retain PCB 100 therein. Wall 40 may also include a recess 45 for receiving connector location 28 of top bracket 12. Wall 42 may include a stop channel 46 that retains an edge portion of PCB 100 when PCB 100 is slid through channels 44.

Bottom bracket 14 may further include diamond-shaped pads 48,60 that align with and support corresponding structures formed on PCB 100, such as, for example, diamond-shaped chips provided on PCB 100. Diamond-shaped pads 48,60 also dissipate heat generated by the PCB chips, preventing the chips from damage caused by overheating. Diamond-shaped pads 48,60 connect with walls 36,40, via support walls 52, 64, respectively. Each support wall 52, 64 has a pair of connection mechanisms 50, 62 provided thereon. Connection mechanisms 50, 62 enable bottom bracket 14 to connect with a heatsink 102 (as shown in FIGS. 3–6) that provides heat dissipation from PCB 100. Heatsink 102 may connect to bottom bracket 14 by providing screws, nuts and bolts, or other similar connection mechanisms through heatsink 102 for connection with corresponding connection mechanisms 50, 62 formed on support walls 52, 64.

Bottom bracket 14 may further include a square-shaped pad 54 that aligns with and supports corresponding structures formed on PCB 100, such as, for example, a square-shaped chip formed on PCB 100. Square-shaped pad 54 also dissipates heat generated by the PCB components, preventing the components from damage caused by overheating. Square-shaped pad 54 connects with walls 36, 40, via support walls 58 that have a pair of connection mechanisms 56 provided thereon. Connection mechanisms 56 also enable bottom bracket 14 to connect with heatsink 102. Heatsink 102 may connect to bottom bracket 14 by providing screws, nuts and bolts, or other similar connection mechanisms through heatsink 102 for connection with corresponding connection mechanisms 56 formed on support walls 58.

Preferably, heatsink 102 alone, or in conjunction with diamond-shaped pads 48,60 and square-shaped pad 54, permit heat to be dissipated from PCB 100 at the same or substantially the same rate that heat is dissipated from PCB 100 when it is installed in a communications module. That is, module 10 and heatsink 102 are heat dissipation neutral. This is an advantageous feature of the present invention since many circuits and components mounted on PCB 100 are temperature dependent and will only operate properly when at certain temperatures. Furthermore, many PCB components are temperature compensated and assume a certain heat dissipation rate. If that rate changes when PCB 100 is in module 10, then accurate tests of PCB 100 may not result.

This is particularly important for PCBs used in the optical communications field where temperature compensation of PCB components is a common and often critically important practice. Indeed, the tolerances are so tight for PCB components used in the optical communications field that a small temperature variation in a PCB component (e.g. lasers and Bragg gratings) could vary the channel wavelength being launched or selected and thereby lead to inaccurate test results. Thus, if a PCB is tested at the wrong temperature then it may not work as intended when placed in the field and could cause a disruption in network traffic. Any such traffic disruption, particularly at modern data rates that may reach or exceed 10 gigabits/second, will cause a major loss of data and revenue.

Top bracket 12 may connect to bottom bracket 14 via various connection mechanisms. For example, top bracket 12 may connect to recess bottom bracket 14 with an adhesive, glue, double-sided tape, nuts and bolts, brackets, spring clips, latches, etc. As shown in FIG. 3, top bracket 12 may connect to bottom bracket 14 by providing mount screws 66 through holes formed in top bracket 12 and bottom bracket 14.

As shown in FIGS. 3–6, connector locations 24, 26 receive and retain externally-threaded SMA connectors 104, each SMA connector 104 having at least one lead 106. SMA connectors 104 may be replaced by a multitude of connector styles, including coaxial connectors, etc. A cable connector 108 provided on one end of an electrical cable 110 may connect and disconnect to each SMA connector 104. The other ends of electrical cables 110 may connect to conventional testing equipment (not shown). Thus, when top bracket 12 is connected to bottom bracket 14, pads 35 provide pressure on leads 106 of SMA connectors 104 so that leads 106 adequately contact corresponding pads on PCB 100. This way, PCB 100 is tested without being permanently affixed.

As even further shown in FIGS. 3–6, connector location 28 receives and retains an internally-threaded SMA connector 112 having at least one lead 114. SMA connector 112 may be replaced by a multitude of connector styles, including coaxial connectors, etc. A cable connector 116 provided on one end of an electrical cable 118 may connect and disconnect to SMA connector 112. The other end of electrical cable 118 may connect to conventional testing equipment (e.g., oscilloscope, voltmeter, etc., not shown). Thus, when top bracket 12 is connected to bottom bracket 14 and L-shaped bracket 32 is connected to top bracket 12, pad 35 provides pressure on lead 114 of SMA connector 112 so that lead 114 adequately contacts a corresponding pad on PCB 100. This way, PCB 100 may be tested without being permanently affixed.

In other words, a portion of a connection force provided by top bracket 12 sandwiching the leads 106, 114 of SMA connectors 104, 112 and pads 35 between PCB 100 and bottom bracket 14, is transferred through pads 35 to the leads 106, 114 of SMA connectors 104, 112, and electrically connects the leads 106, 114 of SMA connectors 104, 112 with corresponding pads of PCB 100.

SMA connectors 104 connect to walls 22, 16 with a variety of connection mechanisms, including adhesive, glue, double-sided tape, nuts and bolts, etc. As shown in FIG. 6, SMA connectors 104 connect to a mounting plate 120 that receives a pair of screws 122. Screws 122 are received and retained in openings formed in walls 22, 16 to connect SMA connectors 104 thereto.

The module 10 of the present invention may be made from a variety of materials. Preferable, the components of module 10 are made from a conductive metal having a conductive protective coating provided thereon. For example, nickel-plated aluminum, or aluminum having a black anodized surface may be used. A conductive Delrin® (registered trademark of E.I. du Pont de Nemours and Company for its brand of acetal resin) is also a possible material. Such materials prevent charge accumulation on PCB 100.

Module 10 may also be a variety of dimensions and shapes which is dependent upon the dimensions, shape, and layout of the PCB to be provided therein. If needed, PCB 100 maybe stored in module 10 for later retrieval. For example, the support pads of module 10 may be configured to retain, support, and dissipate heat from PCBs having a variety of corresponding structures, including but not limited to, chips, lasers, transceivers, etc.

The module 10 of the present invention provides several advantages. It protects PCB 100 at all times during testing and storage, preventing damage, rework, or field failure of PCB 100. As discussed above, module 10 and heatsink 102 are heat dissipation neutral. This enables the circuits and components mounted on PCB 100 to operate properly and provide accurate tests of PCB 100.

The module 10 is also mobile from bench to bench or building to building, and always protects PCB 100 during movement, as long as proper electrostatic discharge (ESD) handling is applied to PCB 100. Because module 10 locks PCB 100 in place, PCB 100 does not need special packaging during transport. Finally, module 10 may be used to assemble parts to or test parts on the PCB 100, since module 10 helps prevent PCB 100 from flexing and damaging already installed components on PCB 100.

Module 10 of the present invention provides ready access to a PCB for testing purposes through the quick disconnect feature enabled by dielectric gasket 35, top bracket 12, and bottom bracket 14. Module 10 also provides testing access to a PCB, without comprising the functionality of the PCB, since the PCB experiences the same heat dissipation rate and operates under normal conditions in module 10 as it would when installed in an assembly.

It will be apparent to those skilled in the art that various modifications and variations can be made in the module of the present invention and in construction of the module without departing from the scope or spirit of the invention. For example, the physical dimensions and material selections of the module are purely exemplary and not limiting of the embodiments of the present invention. Furthermore, SMA connectors 104, 112 may be provided in bottom bracket 14 instead of top bracket 12. That is, top bracket 12 and bottom bracket 14 may be switched without sacrificing the quick connect/disconnect functionality of module 10.

A cooling mechanism, such as, for example, a conventional fan 113, may be provided with module 10. Fan 113 may be provided at various locations around module 10, but preferably, as shown in FIG. 4, is provided at a location to provide a substantially laminar airflow 115 across the surface of PCB 100. Fan 113 may be a conventional fan or an ionizing fan having an ion generator located next to a conventional fan. An ionizing fan would help reduce electrostatic discharge (ESD) buildup on PCB 100. The thermal mapping of PCB 100 would dictate the required fan layout.

A fan would provide a positive airflow to prevent PCB 100 from overheating. Since different PCBs have different thermal profiles, it is preferable to control the speed of the fan to match the thermal profile of the PCB being tested. Accordingly, the fan may be controlled by control signals provided by a conventional controller, such as a programmable logic controller (PLC), a general purpose personal computer programmed with control software, etc. Control software similar to the software disclosed in U.S. Pat. No. 6,188,402, assigned to the assignee of the present application, CIENA Corporation, may be utilized, the disclosure of which is herein incorporated by reference. The type of PCB 100 being tested may be entered into the conventional controller, via, for example, a bar code scanner, and the controller will set the speed of the fan to match the thermal profile of the PCB 100 being tested, and thus prevent undercooling and overcooling of the PCB 100.

Finally, module 10 of the present invention is not limited to use with PCBs used in the communications field. Rather, module 10 may be used with PCBs used in any field, such as, for example, PCBs used in the computer field.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A module for holding a printed circuit board, comprising:
   a top bracket having four walls;
   a bottom bracket interconnecting with said top bracket, said bottom bracket slidably receiving and retaining the printed circuit board,
   at least one wall of said top bracket or said bottom bracket retaining an electrical connector having a lead;
   a dielectric gasket provided on one side of the lead of the electrical connector, wherein a portion of a connection force provided by said top and bottom brackets sandwiching the lead of the electrical connector and said dielectric gasket, is transferred through said dielectric gasket to the lead of the electrical connector, and electrically connects the lead of the electrical connector with a pad of the printed circuit board.

2. A module for holding a printed circuit board as recited in claim 1, wherein each of three walls of said top bracket or said bottom bracket retains an electrical connector having a lead, and said dielectric gasket is provided on one side of each electrical connector lead.

3. A module for holding a printed circuit board as recited in claim 2, wherein each of a first wall and a second wall of said top bracket or said bottom bracket retains an externally-threaded SMA connector as an electrical connector, and a third wall of said top bracket or said bottom bracket retains an internally-threaded SMA connector as an electrical connector.

4. A module for holding a printed circuit board as recited in claim 1, wherein two walls of said bottom bracket include channels that slidably receive and retain the printed circuit board therein, and another wall of said bottom bracket includes a stop channel that retains an edge portion of the printed circuit board when the printed circuit board is slid through the channels.

5. A module for holding a printed circuit board as recited in claim 1, wherein said bottom bracket has pads connected between two walls thereof that align with and support corresponding components provided on the printed circuit board and dissipate heat generated by the printed circuit board components.

6. A module for holding a printed circuit board as recited in claim 1, wherein said bottom bracket has substantially the same shape as said top bracket.

7. A module for holding a printed circuit board as recited in claim 1, wherein the pads of said bottom bracket are substantially the same size as the printed circuit board components they align with and support.

8. A module for holding a printed circuit board as recited in claim 1, further comprising a heatsink connected to said bottom bracket, wherein said heatsink permits heat to be dissipated from the printed circuit board at substantially the same rate that heat is dissipated from the printed circuit board when it is installed in an assembly.

9. A module for holding a printed circuit board as recited in claim 5, further comprising a heatsink connected to said bottom bracket, wherein said heatsink, in conjunction with the pads, permit heat to be dissipated from the printed circuit board at substantially the same rate that heat is dissipated from the printed circuit board when it is installed in an assembly.

10. A module for holding a printed circuit board as recited in claim 1, wherein a cable connector provided on one end of an electrical cable connects to the electrical connector, the other end of the electrical cable connects to testing equipment, and when the lead of the electrical connector electrically connects with the pad of the printed circuit board, the printed circuit board may be tested by the testing equipment, via the electrical cable.

11. A module for holding a printed circuit board as recited in claim 1, wherein said top bracket connects to said bottom bracket with mount screws provided through holes formed in said top bracket and said bottom bracket.

12. A module for holding a printed circuit board as recited in claim 1, wherein an L-shaped support bracket is provided above the electrical connector, and a portion of the L-shaped support bracket contacts said dielectric gasket provided above the lead of the electrical connector.

13. A module for holding a printed circuit board as recited in claim 1, wherein said dielectric gasket comprises a material that absorbs the force applied to the lead of the electrical connector and electrically isolates and insulates the lead.

14. A module for holding a printed circuit board as recited in claim 1, wherein said dielectric gasket comprises a microwave-absorbable and radar-absorbable material.

15. A module for holding a printed circuit board as recited in claim 1, further comprising a cooling mechanism spaced from the module and providing a substantially laminar airflow across the surface of the printed circuit board to prevent the printed circuit board from overheating.

16. A module for holding a printed circuit board as recited in claim 15, wherein said cooling mechanism comprises a fan.

17. A module for holding a printed circuit board as recited in claim 15, wherein said cooling mechanism comprises an ionizing fan having an ion generator adjacent to a fan.

18. A module for holding a printed circuit board as recited in claim 17, wherein the ionizing fan reduces electrostatic discharge buildup on the printed circuit board.

* * * * *